United States Patent [19]

Head et al.

[11] Patent Number: 4,622,282

[45] Date of Patent: Nov. 11, 1986

[54] PHOTOGRAPHIC METHOD FOR FORMING IMAGES ON PLAIN PAPER

[75] Inventors: Donald L. Head; Richard F. Wright, both of Chillicothe; Edward J. Saccocio, Columbus, all of Ohio

[73] Assignee: The Mead Corporation, Dayton, Ohio

[21] Appl. No.: 770,539

[22] Filed: Aug. 28, 1985

Related U.S. Application Data

[63] Continuation-in-part of Ser. No. 703,255, Feb. 20, 1985, abandoned.

[51] Int. Cl.$^4$ .............................. G03C 1/72; B05D 7/00
[52] U.S. Cl. ..................................... 430/138; 428/211; 428/402.2
[58] Field of Search ...................... 430/138; 428/402.2, 428/211

[56] References Cited

U.S. PATENT DOCUMENTS

| | | | |
|---|---|---|---|
| 3,072,481 | 1/1963 | Berman et al. | 430/138 |
| 4,211,437 | 7/1980 | Myers et al. | 428/402.2 |
| 4,399,209 | 8/1983 | Sanders et al. | 430/138 |

Primary Examiner—John E. Kittle
Assistant Examiner—Mukund J. Shah
Attorney, Agent, or Firm—Biebel, French & Nauman

[57] ABSTRACT

Images are formed on plain paper using imaging sheets having a coating containing a chromogenic material and a photosensitive composition with at least the photosensitive composition encapsulated in a layer of rupturable microcapsules as an internal phase by a process which comprises image-wise exposing the imaging sheet to actinic radiation, subjecting the microcapsules to a uniform rupturing force, placing the imaging sheet in contact with a sheet of plain paper with the layer of microcapsules adjacent the sheet of plain paper, the steps of subjecting the layer of microcapsules to the rupturing force and placing the imaging sheet in contact with the sheet of plain paper being conducted such that the chromogenic material is image-wise transferred to the sheet of plain paper, and applying a developer material to the surface of the sheet of plain paper to which the chromogenic material is transferred, the developer material thereupon reacting with the chromogenic material and producing a visible image.

21 Claims, 7 Drawing Figures

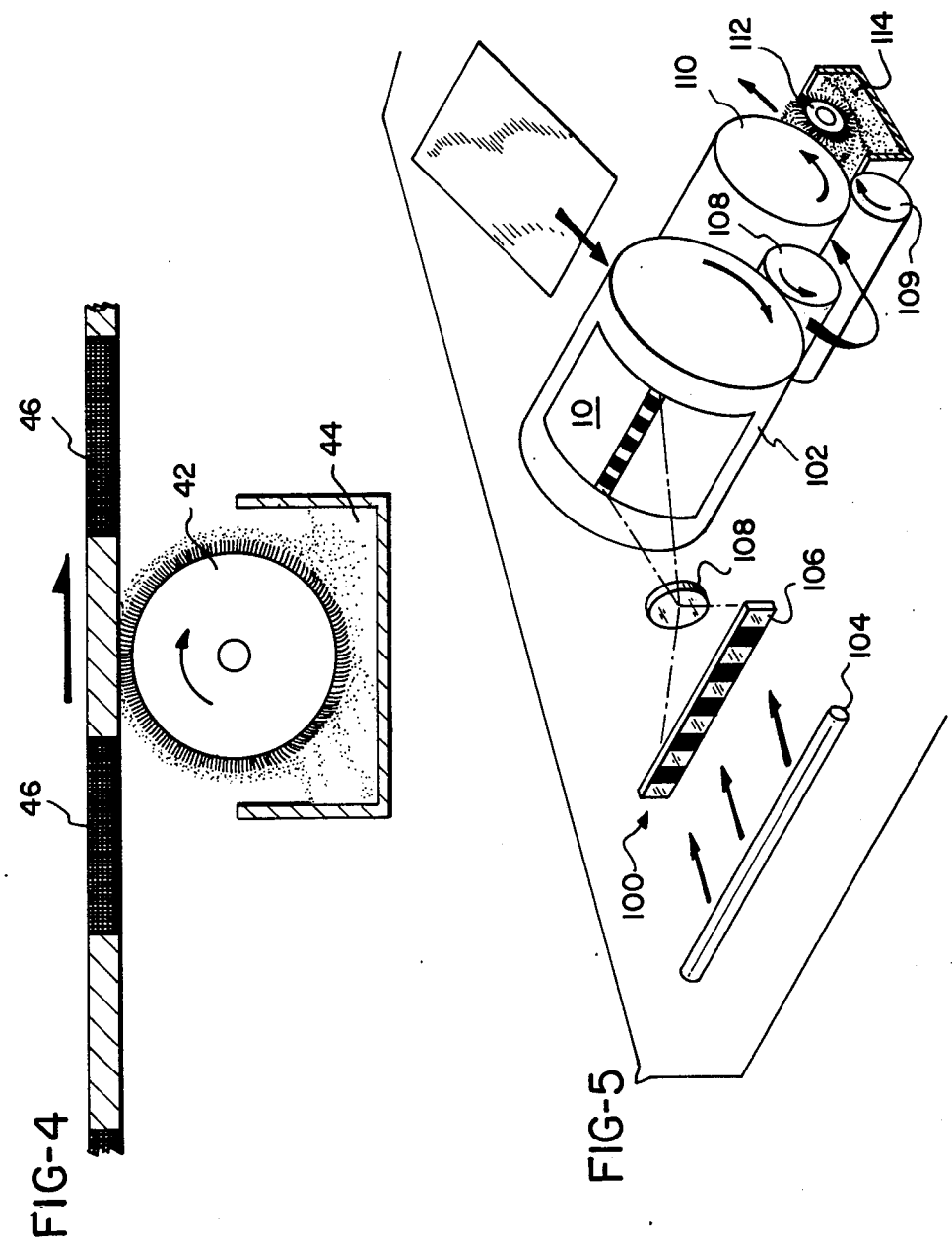

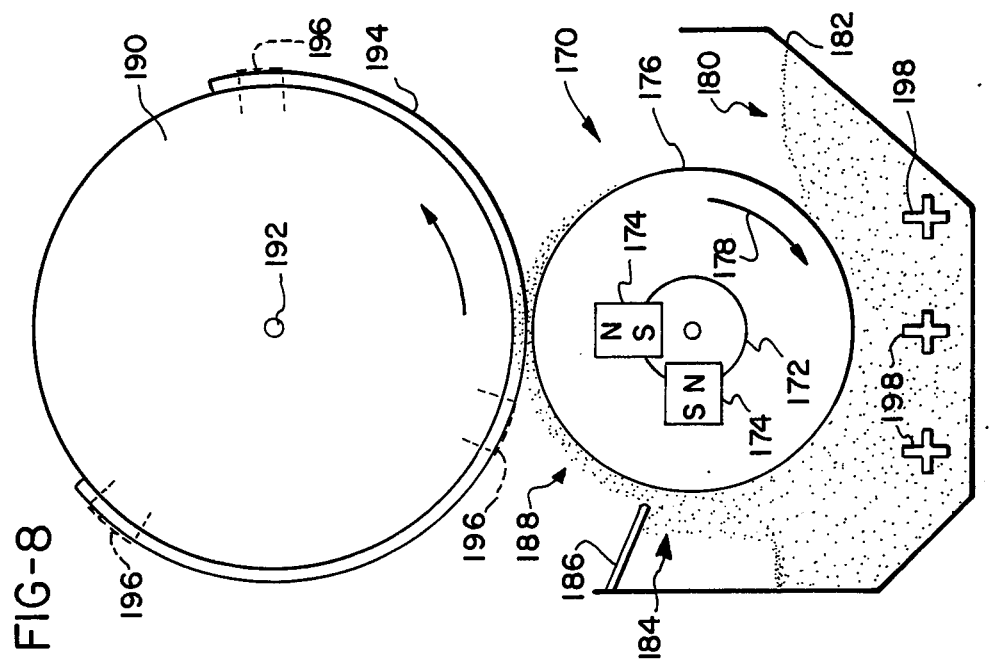

PHOTOGRAPHIC METHOD FOR FORMING IMAGES ON PLAIN PAPER

CROSS-REFERENCE TO RELATED APPLICATIONS

This application is a continuation-in-part of U.S. application Ser. No. 703,255 filed Feb. 20, 1985 abandoned.

BACKGROUND OF THE INVENTION

The present invention relates to a method for forming images using the imaging sheets described in U.S. Pat. No. 4,399,209. More particularly, it relates to a method for forming images on plain paper.

U.S. Pat. No. 4,399,209 to The Mead Corporation describes a transfer imaging system wherein an imaging sheet comprising a support and a layer of microcapsules containing a chromogenic material and a photosensitive composition is image-wise exposed to actinic radiation. The exposed sheet is next assembled with a developer sheet and the two are passed through a calender nip whereupon the microcapsules rupture and the contents of the microcapsules are image-wise transferred to the developer sheet where they react and form a colored image. Typically, the photosensitive composition is a photocurable composition containing an ethylenically unsaturated compound and a photoinitiator, the chromogenic material is a substantially colorless electron donating compound, and the developer is a electron acceptor such as an aromatic carboxylic acid salt.

Upon image-wise exposing the imaging sheet to actinic radiation, the internal phase of the microcapsules is hardened in the exposed areas. The internal phase in the unexposed areas remains liquid and the internal phase in areas receiving an intermediate level of exposure is hardened to an intermediate degree. Thus, the microcapsules in the unexposed areas are capable of rupturing and releasing the internal phase upon subjecting the exposed imaging sheet to a uniform rupturing force. The microcapsules in the underexposed areas may rupture and release the internal phase to an intermediate degree. In this manner, the internal phase of the microcapsules is image-wise transferred to the developer sheet where the image is obtained.

While the transfer imaging system described in U.S. Pat. No. 4,399,209 can be used in numerous formats and be designed to be useful in various applications, the user must purchase two coated paper products to reproduce images, namely, the imaging sheet and the developer sheet. It would be desirable to form images on plain paper. Furthermore, the final image is obtained on a chemically coated paper which may cause skin irritation and does not have a desirable feel.

SUMMARY OF THE INVENTION

A principal object of the present invention is to provide a photographic process in which images are formed on plain paper.

A further object of the present invention is to provide a photographic process for forming images on plain paper which is a dry process, i.e., it does not involve wet development processing steps.

Another object of the present invention is to provide a photographic process which is useful in forming full color images on plain paper.

These and other objects of the present invention are achieved via a process for forming images which comprises image-wise exposing an imaging sheet to actinic radiation wherein the imaging sheet includes a support having a chromogenic material and a layer of microcapsules containing a photosensitive composition, subjecting the microcapsules to a uniform rupturing force, contacting a sheet of plain paper with the imaging sheet such that the chromogenic material is image-wise transferred to the sheet of plain paper, separating the sheet of plain paper from the imaging sheet, and contacting the surface of the sheet of plain paper carrying the chromogenic material with a developer material which reacts with the transferred chromogenic material and forms a visible image. Preferably, the chromogenic material is present in the microcapsules with the photosensitive composition.

In accordance with the aforementioned process, the microcapsules can be ruptured with the imaging sheet in contact with the plain paper or separately. The former practice is preferred because it simplifies handling and tends to maximize the amount of chromogenic material transferred from the imaging sheet to the plain paper sheet. When the microcapsules are ruptured and the chromogenic material is transferred to the plain paper in separate steps, there is a tendency to lose some of the chromogenic material and, consequently, it is more difficult to obtain good image density.

In accordance with one embodiment of the invention, the developer material is provided on the surface of the imaging sheets with the microcapsules and chromogenic material. The developer is preferably provided in admixture with the microcapsules in a single layer on the surface of the imaging sheet, but embodiments are also possible in which the developer is provided in a separate layer underlying the layer of microcapsules.

When the developer is provided on the surface of the imaging sheet, the developer is optionally encapsulated. In this case, a liquid developer or a developer solution is used. Solid developers such as developer resins can be directly mixed with the microcapsules and provided in a layer on the support.

With the developer present on the surface of the imaging sheet, images are formed by simply image-wise exposing the sheet to actinic radiation, subjecting the sheet to a uniform rupturing force, and effecting transfer to the surface of the plain paper. The developer and the chromogenic material begin to react as they are transferred to the surface of the plain paper.

In accordance with another embodiment of the invention, full color images are formed through the use of an imaging sheet carrying microcapsules having distinct sensitivities and respectively containing cyan, magenta, yellow and optionally black color formers. In this process, a color image is resolved into its red, green, blue and optionally black components, each of which is then respectively translated into radiation to which the photosensitive composition associated with the complimentary color former is sensitive. The imaging sheet is then sequentially or simultaneously image-wise exposed to the translated radiation. A full color image is then obtained on the surface of a plain sheet of paper by the process of subjecting the microcapsules to a uniform rupturing force, contacting the sheet of paper with the imaging sheet, and treating the surface of the paper to which the chromogenic material is transferred with a developer material as described above.

BRIEF DESCRIPTION OF THE DRAWINGS

FIGS. 1-4 schematically illustrate the imaging process of the present invention.

FIG. 5 is one example of an imaging apparatus useful in carrying out the process of the present invention.

FIG. 6 is a schematic illustration of one apparatus for applying developer in accordance with the present invention.

FIG. 7 is a schematic illustration of an apparatus for applying developer from a particle bed in accordance with the present invention.

FIG. 8 is a schematic illustration of a magnetic brush useful in applying developer in accordance with the present invention.

DEFINITIONS

The term "microcapsules" as used herein includes both microcapsules having discrete walls and microcapsules within a so-called open phase system consisting of a dispersion of the internal phase in a binder.

The term "photosensitive composition" as used herein means compositions which undergo a change in viscosity upon exposure to actinic radiation.

The term "actinic radiation" includes the entire electromagnetic spectrum including ultraviolet and infrared radiation, X-rays, and particle radiation such as ion beam radiation.

The term "plain paper" as used herein refers to paper which is not coated with a developer material. It includes bond paper as well as papers which are treated or manufactured using techniques which enhance the quality of the image obtained in accordance with the present invention. It is desirable to use papers in which surface irregularities (roughness) is minimized.

DETAILED DESCRIPTION OF THE INVENTION

U.S. Pat. No. 4,399,209 is incorporated herein by reference. The patent describes imaging sheets useful in the present invention in detail as well as the mechanism by which the microcapsules selectively release the chromogenic material. U.S. application Ser. No. 339,917 filed Jan. 18, 1982 and U.S. application Ser. No. 620,994 filed June 15, 1984, are also incorporated herein by reference. These applications disclose imaging sheets useful in forming full color images as well as methods for exposing the imaging sheets to obtain full color images.

The present invention is based upon the discovery that an imaging sheet, otherwise useful in forming images by transfer to a color developer sheet, can be used to form images on plain paper by effecting a transfer of chromogenic material to paper instead of a developer sheet and thereafter treating the paper with a developer material. It has been found that a transfer of chromogenic material from the imaging sheet to paper can be effected and a sufficient quantity of the chromogenic material remains accessible on the surface of the paper to react with a developer material and form an image.

Figure 1:
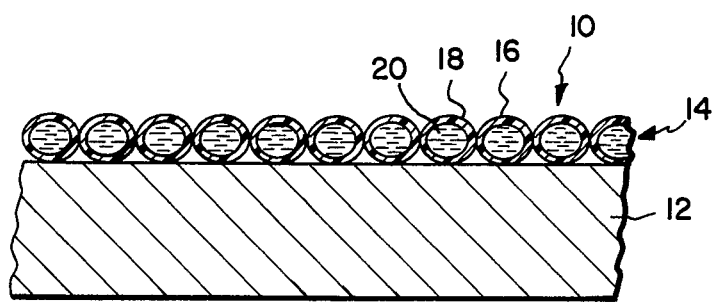

A typical example of the imaging sheet used in the present invention is shown in FIG. 1. The sheet 10 comprises a support 12 (preferably a thin plastic film) and a layer 14 of microcapsules 16. The microcapsules can be formed with discrete walls or consist of a dispersion of internal phase in a binder. In the former case the microcapsules are formed by processes such as coacervation or polymerization. Where the microcapsules have discrete walls, they may be adhered to the support 12 with a binder or, in many instances, the wall forming compounds themselves adhere the microcapsules to the support.

The microcapsules shown in FIG. 1 have a discrete wall 18 and contain an internal phase 20. The internal phase typically consists of the photosensitive composition and the chromogenic material. In some cases, however, the chromogenic material is not in the internal phase. Rather, it is associated with the microcapsules in other ways, such as by placing the chromogenic material in the capsule wall or in a layer contiguous with the microcapsules. In the latter case, the internal phase is designed to dissolve the chromogenic material as it is released from the microcapsules and carry it to the plain paper. When the developer is present on the surface of the imaging sheet with the chromogenic material, means must be provided to prevent the developer from reacting with the chromogenic material. This is typically resolved by encapsulating one or both of the developer and the chromogenic material.

The photosensitive composition can be a photohardenable or photosoftenable composition. In the former case, exposure inhibits or prevents chromogenic material from being transferred to the paper sheet. In the latter case, exposure enhances the ability of the chromogenic material to be transferred to the paper sheet. In FIG. 1, the internal phase is liquid and represents an unexposed photocurable composition. Typical examples of photosensitive compositions useful in the present invention are described in U.S. Pat. No. 4,399,209. A composition containing trimethylol propane triacrylate and a photoinitiator is a representative example of a photohardenable composition.

Figure 2:
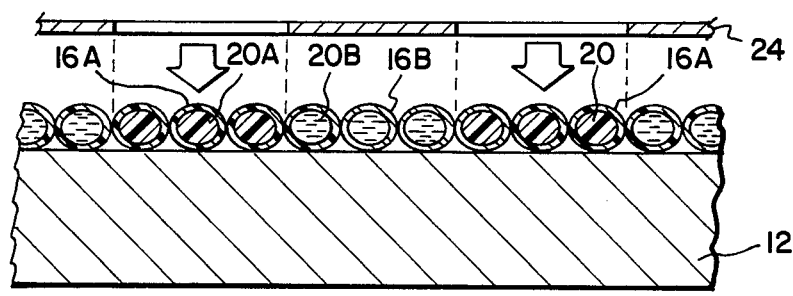

Exposure of the microcapsules is illustrated schematically in FIG. 2. The exposed and unexposed areas are defined by a photomask 24 through which radiation (designated by arrows) from an unshown source selectively passes. Exposure solidifies the internal phase 20A of the exposed microcapsules 16A while the internal phase 20B of the unexposed or underexposed microcapsules 16B remains liquid. The illustration in FIG. 2 is a simplified illustration of exposure and the distribution of exposed and unexposed microcapsules on the surface of the imaging sheet. Depending upon the nature of the photosensitive composition, intermediate degrees of exposure will produce an intermediate degree of hardening of the internal phase resulting in the chromogenic material being transferred to the plain paper in an intermediate amount. In a full color imaging system, in accordance with one embodiment of the invention, a predetermined area on the surface of the imaging sheet will include a combination of exposed microcapsules, unexposed microcapsules, and microcapsules exposed to an intermediate degree. The image produced in accordance with the present invention is thus the product of a combination of microcapsules rupturing and releasing their internal phases in accordance with degree of exposure.

Various imaging apparatuses can be used to expose the imaging sheets in the present invention. It is anticipated that the imaging process of the present invention will be used to copy computer generated output and for this purpose certain electronically controlled imaging apparatuses will be used. Typical examples of such electronic imaging apparatuses include light valve imaging apparatuses of the type described in U.S. Pat. Nos. 4,229,095; 4,367,946; and 4,406,521. Cathode ray tubes and certain laser imaging apparatuses can also be used to image-wise expose the imaging sheet in accordance with the present invention. Of course, photomasks can also be used.

Where full color images are produced, the preferred exposure device will control three or four distinct bands of radiation which may be emitted from a single radiation source or a plurality of sources. For example, a Dunn or matrix camera may be used to produce electronic signals corresponding to the cyan, magenta, and yellow (and optionally black) images that are desired. This output drives the electronic control means for an exposure device which may include a conventional multiplexer logic package and timing means. The exposure device selectively emits radiation to which the microcapsules on the imaging sheet are sensitive and thereby image-wise exposes the imaging sheet.

Figure 3:
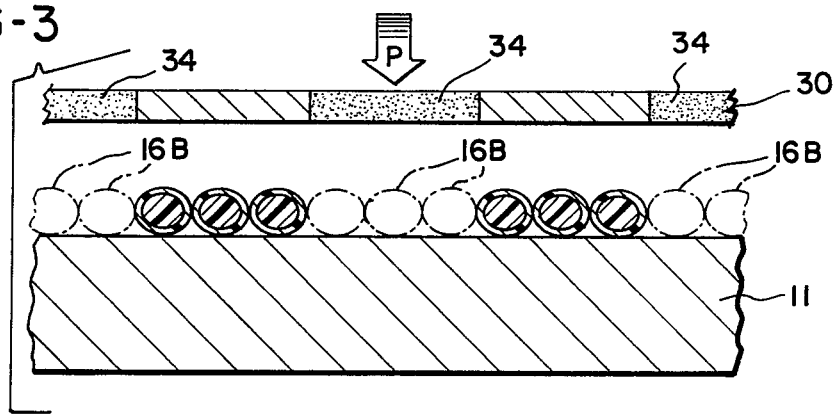

Following exposure of the imaging sheet, it is usually assembled with a sheet of plain paper 30, as shown in FIG. 3, and the microcapsules are subjected to a uniform rupturing force. This is conveniently accomplished by passing the paper and imaging sheet in unison through the nip between a pair of pressure rollers. This causes the unexposed and/or underexposed microcapsules 16B to rupture and release the internal phase. In contact with paper 30, the internal phase is transferred to the paper where a latent image 34 in the form of unreacted chromogenic material is formed.

FIG. 3 illustrates the most typical approach to rupturing the microcapsules and transferring the chromogenic material to the paper surface wherein the paper is in contact with the image-wise exposed imaging sheet as the capsules are ruptured. Images can also be formed by rupturing the microcapsules and transferring the chromogenic material in separate steps. For example, the microcapsules can be ruptured by contacting the imaging sheet with the fibrous outer surface of a developer roll as described in U.S. Pat. No. 4,448,516 and, thereafter, the imaging sheet can be assembled with the paper sheet with pressure to effect transfer of the chromogenic material and the formation of the latent image in the form of unreacted chromogenic material.

After transfer, the paper is contacted with a developer material and the image is developed through reaction of the chromogenic material and the developer. This procedure is illustrated in FIG. 4 wherein a paper 30 is shown in contact with a rotating developer applicator brush 42. The brush 42 applies developer material 44 onto the surface of paper 30 where it reacts with the chromogenic material and produces the color image 46. The brush 42 can be a brush having a fibrous outer surface as described in U.S. Pat. No. 4,448,516, or it can be a socalled magnetic brush of the type conventionally used in applying xerographic toner.

The developer is preferably a dry material which is dusted upon or otherwise applied to the surface of the paper carrying the chromogenic material. It is envisioned, however, that for certain applications it may be desirable to apply the developer in the form of a solution to accelerate the reaction between the developer and the chromogenic material and to enable the developer to react with chromogenic material which is absorbed by the paper and may not be accessible to a completely dry developer material. If the developer is applied as a liquid, it is desirable to minimize the wetting of the paper and to dry the paper if necessary.

The latent image can be developed by contacting the imaging sheet 30 with a bed of developer material. This can be accomplished by passing the paper through a trough containing dry developer material. This can be accomplished as shown in FIG. 6. Therein, a tray 144 supports the body of free particles 129 and a cylinder 146 is horizontally mounted above the tray 144 for rotation about an axis 147. The cylinder 146 is located relative to the tray 144 such that a sector 148 of the circumference of the cylinder 146 extends into the body of free particles 129. The free particles can consist of particles of solid developer material or a combination of developer material and a dispersant such as sand. A sheet of plain paper 150 carrying a latent image is secured to the cylinder 146 such that the surface of the paper 150 is mounted with the latent image facing outwardly. The paper 150 is then processed by rotating the cylinder 146 such that the surface of the paper 150 contacts the body of free particles 129. The operation of the embodiment of FIG. 6 may be enhanced by vibrating the tray 144 as the cylinder 146 is rotated, such vibration being indicated by an arrow 152.

Another embodiment of apparatus for performing development in accordance with the present invention is shown in FIG. 7. In this embodiment, a primary cylindrical drum 154 is mounted for rotation about a horizontal axis 156. A secondary retaining drum 157 is positioned concentrically within drum 154 with the paper 153 and developer particles 129 being inserted between drums 153 and 154. The paper 153 is positioned along the interior of the surface of the drum 154 by means of insertion through a slot 160 which is angled in the direction of drum rotation indicated by the arrow 162. The paper 153 is held against the inside surface of drum 154 by the secondary drum 157. Alternatively, paper 153 can be held against the inside of the drum 154 by means of clamping members.

As the drum 154 is rotated, the particles 130 of the body of free particles 129 carrying the developer move over the surface of the paper 153 to develop the latent image thereon. Preferably, the speed of rotation of the primary cylindrical drum 154 is limited such that the particles 129 do not tumble, i.e., the particles are not thrown around in the drum, and are not held against the interior of the drum 154 by centrifigual forces. Rather, the speed is selected such that the particles are carried partially up the interior surface of the drum and then return toward the bottom of the drum in an oscillatory wave-like motion defining a swishing action.

FIG. 8 shows a schematic cross-sectional view of an apparatus for developng the latent image using a magnetic brush in accordance with the present invention. A magnetic brush 170 includes a fixed shaft 172 having at least one pair of magnets 174 fixed thereto. The shaft 172 is situated within a cylindrical sleeve 176 which is rotated in the clockwise direction in the illustrative embodiment as indicated by an arrow 178. The sleeve 176 engages a body of magnetically attractable free particles 180 carrying developer which is held within a sump or trough 182 which is axially aligned with the magnetic brush 170. It is noted that other designs of magnetic brushes maintain an outer sleeve fixed and rotate an inner magnetized member to form a traveling pile on the outer sleeve.

As the sleeve 176 is rotated, the particles 180 stand up in trees or bristle-like formations to form a pile 184 on the outer surface of the sleeve 176. The pile 184 formed on the sleeve 176 rotates in the clockwise direction with the sleeve 176 as indicated by the arrow 178 into engagement with a trim blade or doctor blade 186 which is adjusted to define the length of the pile 188 on the section of the magnetic brush 170 which is to engage an imaging sheet. A sheet of plain paper 194 carrying a latent image is passed over the pile 188 on the magnetic brush 170 and is contacted by the pile 188 such that the developer is carried to the surface of the paper where it reacts with the latent image.

The paper may be placed in contact with the pile of the magnetic brush in a variety of ways. In accordance with this embodiment of the present invention, a carrier cylinder 190 is mounted for rotation about an axis 192 parallel to the magnetic brush 170 with the cylinder 190 being sized and positioned such that the pile 188 traveling on the magnetic brush 170 is just slightly greater than the gap between the sleeve 176 and the cylinder 190. The carrier cylinder 190 can be operated in the same or opposite direction as that of the moving pile on the magnetic brush 170. However, it is preferred that paper 194 secured to the outer surface of the cylinder 190 travel in the same direction as the pile 188 on the magnetic brush 170 and the magnetic brush 170 rotate at a higher tangential velocity than cylinder 190 such that the pile 188 sweeps along the surface paper 194 carrying the latent image.

The paper 194 may be secured to the cylinder 190 by sheet stabilizing means comprising clips 196 or preferably by means of vacuum systems well known in the art. The particles 180 are deposited back to the trough 182 as the cylinder 176 is rotated such that the particles 180 are continuously recirculated to form the pile 188 of the brush 170. It may be desirable to provide particle agitation means within the trough 182, such as stirrers 198, as shown.

As a further alternative, the paper sheet can be sprayed or coated with the developer in powder or liquid form using well known techniques.

It is often desirable to heat the paper to accelerate development and enhance the image density. This treatment can be carried out as the developer is applied or thereafter depending upon the mode of its application. The heating conditions are not critical. A treatment at 50°-60° C. for 1-5 seconds is often sufficient.

In accordance with another embodiment of the present invention, the imaging sheet shown in FIG. 1 is modified to include a developer material on the surface of the sheet with the microcapsules containing the photosensitive composition. The imaging sheet is used in a manner similar to the imaging sheet of FIG. 1 except the step of applying the developer material to the plain paper is carried out at the same time as the chromogenic material is transferred to the surface of the sheet of plain paper.

The developer material may be provided on the surface of the imaging sheet in the same layer as the microcapsules (i.e., layer 14 in FIG. 1) or in a separate layer underlying the layer of microcapsules. In accordance with one embodiment of the invention, the developer material is admixed with the microcapsules and coated on the support. In another embodiment of the invention, the developer material is encapsulated in microcapsules. If the microcapsules contain a photosensitive composition in addition to the developer, the release and transfer of the developer material is controlled by image-wise exposure of the imaging sheet to actinic radiation. Since the developer is encapsulated, a liquid developer or a developer solution may be used.

As previously indicated, means other than pressure can be used to rupture the microcapsules. For example, in other embodiments the microcapsules can be ruptured ultrasonically, by abrasion as described in U.S. Pat. No. 4,448,516, or by heating. In the latter case the microcapsules may include an agent which generates a gas upon heating above a predetermined temperature. The latter processes can also be performed separately or with the paper sheet in contact with the surface of the imaging sheet. To obtain the maximum transfer of chromogenic material from the imaging sheet to the paper, it is preferred to rupture the microcapsules in contact with the paper sheet as illustrated in FIG. 3.

The process of the present invention can be carried out using plain bond paper. It will be noted, however, that other papers may be used. Preferred papers will have the property of retaining a sufficient quantity of the chromogenic material on the surface of the paper where it can react with a dry developer material. Papers which are highly absorbent and which draw the chromogenic material into the paper where it is not accessible to the developer are not desirable.

Those skilled in the art will appreciate that various apparatus designs are available for carrying out the process of the present invention. Exposure and development are preferably integrated in a single imaging device although separate devices can be designed for each function.

One example of an apparatus useful in the present invention is shown schematically in FIG. 5. The basic elements of the apparatus are a light valve exposure device 100, an exposure drum 102, a pressure roller 108, a transfer roll 109, a carrier drum 110, and a developer applicator 112. The operation of light valve exposure device 100 is described in more detail in U.S. Pat. No. 4,229,095. The light valve exposure device 100 exposes the imaging sheet 10 as it is scrolled past the device on the exposure drum 102. The light valve exposure device includes a radiation source 104, a light valve array 106, and lens means 108 for focusing the array output onto a strip 11 of the imaging sheet 10. The radiation source 104 and the array 106 are electronically controlled by means not shown here.

In forming full color images, the radiation source 104 must emit radiation to which each set of the microcapsules on the imaging sheet is sensitive. This is usually accomplished by using a radiation source which emits radiation over a fairly broad range of wavelengths in combination with filters which are synchronized with the operation of light valve array 106.

After exposure, drum 102 rotates the imaging sheet 10 into contact with plain paper 30 which is fed into contact with the drum at the nip between drum 102 and pressure roller 108. Roller 108 applies sufficient pressure to the combination of imaging sheet 10 and paper 30 to rupture the microcapsules on sheet 10 and effect an image-wise transfer of the chromogenic material contained or otherwise associated with the microcapsules on sheet 10 to the paper 30. A latent image is thus formed as shown in FIG. 3 above.

Paper 30 is stripped from drum 102 by conventional means such as a stripping gate (not shown) and conveyed around pressure roller 108 and transferred via roll 109 to carrier drum 110 to which the paper is attached via a vacuum or other means.

As the drum 110 is rotated, paper 30 is contacted with a developer brush 112 which carries a dry developer material from sump 114 to the surface of sheet 30 where it reacts with the chromogenic material on the surface of paper sheet 30 and produces a color image. Drum 110 may be heated to accelerate development.

The rate with which the image is developed on paper 30 is a function of the amount of chromogenic material transferred to the surface of paper 30, as well as the amount of developer material applied to the surface of the sheet and the temperature of the sheet. In most cases, several revolutions of the paper on carrier roll 108 in contact with developer roll 112 will be required to produce the visible image.

Using one developer roll as shown in FIGS. 4 and 5, development can require about one minute. One means of reducing the development time is to use a plurality of developer rolls in tandem to apply the developer to the surface of the imaging sheet. With the addition of each developer roll, the development time is reduced proportionately.

As indicated initially, the imaging sheet described in U.S. Pat. No. 4,399,209 is suitable for use in the present invention. Certain modifications of the imaging sheet may, however, be desirable to facilitate plain paper copying. In particular, it appears to be desirable to use a higher amount of chromogenic material in the internal phase of the microcapsules in order to deliver more chromogenic material to the surface of the paper. This can be accomplished by using a higher concentration of chromogenic material in the microcapsules or using a larger microcapsule containing more internal phase. Typically, the internal phase of the microcapsules used in the present invention contains about 0.5 to 20% by weight of the chromogenic material.

The developer used in the present invention can be selected from among those materials conventionally used for the purpose in the carbonless paper art. One of the most advantageous features of the present invention is that it functions as a totally dry photographic process. One of the preferred developers is a resin grind containing an aromatic carboxylic acid or salt thereof prepared according to the teachings in U.S. Pat. No. 3,864,146 to Oda et al and, more particularly, a resin grind containing 3,5-di( -methylbenzyl)salicylate. Other developers that can be used in the present invention include acid clay, active clay, acid polymers such as phenol-formaldehyde resins, phenols such as p-cresol and p-octyphenol, aromatic carboxylic acids such as 3,5-di-tert-butylsalicylic acid and salts thereof, and the like. Developers can also be applied in liquid form in accordance with certain embodiments of the invention although this may necessitate additional processing steps.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. A process of forming images using an imaging sheet comprising a support having a chromogenic material and a layer of microcapsules containing a photosensitive composition on the surface thereof, which comprises the steps of:

image-wise exposing said imaging sheet to actinic radiation, subjecting said layer of microcapsules to a uniform rupturing force;

placing said imaging sheet in contact with a sheet of plain paper with said layer of microcapsules adjacent said sheet of plain paper, said steps of subjecting said layer of microcapsules to said rupturing force and placing said imaging sheet in contact with said sheet of plain paper being conducted in either order such that said chromogenic material is image-wise transferred to said sheet of plain paper, and applying a developer material to the surface of said sheet of plain paper to which said chromogenic material is transferred, said developer material thereupon reacting with said chromogenic material and producing a visible image.

2. The process of claim 1 wherein said photosensitive composition is a photohardenable composition and said chromogenic material is encapsulated with said photohardenable composition in microcapsules having discrete walls.

3. The process of claim 2 wherein said chromogenic material is a substantially colorless electron donating compound and said developer material is an electron accepting compound.

4. The process of claim 3 wherein said imaging sheet is placed in contact with said sheet of plain paper prior to subjecting said layer of microcapsules to said uniform rupturing force.

5. The process of claim 4 wherein the steps of subjecting said layer of microcapsules to said uniform rupturing force comprises passing said imaging sheet in contact with said sheet of plain paper through a pressure nip on a calender press.

6. The process of claim 5 wherein said step of image-wise exposing said imaging sheet comprises image-wise exposing said sheet using an electronic imaging device.

7. The process of claim 6 wherein said electronic imaging device is a light valve imaging device.

8. The process of claim 1 wherein said developer material is a dry electron accepting compound.

9. The process of claim 8 wherein said developer material is a resin grind.

10. The process of claim 1 wherein said step of applying said developer material comprises contacting the surface of said sheet of plain paper carrying said transferred chromogenic material with a fibrous roller carrying a dry developer material.

11. The process of claim 1 wherein said paper retains a sufficient quantity of said transferred chromogenic material on the surface of said paper to react with said developer material and form a visible image.

12. The process of claim 4 wherein said process comprises the additional step of heating said paper to accelerate the reaction of said chromogenic material and said developer material.

13. The process of claim 1 wherein said developer material is applied to the surface of said sheet of plain paper by passing said sheet of plain paper carrying said chromogenic material through a body of particles containing a dry developer material.

14. The process of claim 1 wherein said developer material is applied to said sheet of plain paper by contacting said sheet of plain paper with a magnetic brush carrying a dry developer material.

15. The process of claim 2 wherein said developer material is a liquid developer material which is encapsulated and is co-present on the surface of said imaging sheet with said microcapsules containing said photosensitive composition and said developer material is applied to the surface of said sheet of said plain paper by transfer from said imaging sheet with said chromogenic material.

16. The process of claim 15 wherein said developer is encapsulated in microcapsules having discrete walls.

17. The process of claim 16 wherein said microcapsules containing said developer additionally contain a photohardenable composition.

18. The process of claim 2 wherein said developer in co-present on the surface of said imaging sheet with said microcapsules containing said photosensitive composition, and said developer is applied to the surface of said sheet of said plain paper by transfer from said imaging sheet with said chromogenic material.

19. A process for forming images on plain paper comprising:
    image-wise exposing an imaging sheet comprising a support having, on the surface thereof, a layer of microcapsules, said microcapsules containing a photohardenable composition and a chromogenic material, said support further carrying a developer material which is capable of reacting with said chromogenic material and producing a visible color, said developer material being present in said layer of microcapsules or being present in a separate layer;
    placing said imaging sheet in contact with a sheet of plain paper such that said layer of said microcapsules faces said sheet of plain paper;
    subjecting said microcapsules to a uniform rupturing force such that said chromogenic material is image-wise released from said microcapsules and transferred to said sheet of plain paper, said chromogenic material released from said microcapsules reacting with said developer material to form a visible image.

20. The process of claim 1 wherein said imaging sheet is useful in forming full color images.

21. The process of claim 19 wherein said imaging sheet is useful in forming full color images.

* * * * *

UNITED STATES PATENT AND TRADEMARK OFFICE
CERTIFICATE OF CORRECTION

PATENT NO. : 4,622,282

DATED : November 11, 1986

INVENTOR(S) : Donald L. Head, Richard F. Wright, Edward J. Saccocio

It is certified that error appears in the above-identified patent and that said Letters Patent is hereby corrected as shown below:

On the face of the patent under "References Cited", the following additional patents should be cited:

| | |
|---|---|
| 3,219,446 | Berman |
| 4,474,898 | Matsushita et al. |
| 4,486,764 | Matsushita et al. |
| 4,501,809 | Hiraishi et al. |

Signed and Sealed this

Fourteenth Day of April, 1987

Attest:

DONALD J. QUIGG

Attesting Officer

Commissioner of Patents and Trademarks